United States Patent [19]

Koyanagi

[11] 4,117,476
[45] Sep. 26, 1978

[54] DIGITAL-TO-ANALOG CONVERTER

[75] Inventor: Yukio Koyanagi, Katano, Japan

[73] Assignee: Matsushita Electric Industrial Co., Ltd., Japan

[21] Appl. No.: 764,761

[22] Filed: Feb. 2, 1977

[30] Foreign Application Priority Data

Jun. 2, 1976 [JP] Japan .................................. 51-12522

[51] Int. Cl.² .......................................... H03K 13/20
[52] U.S. Cl. ............................................ 340/347 DA
[58] Field of Search .................... 340/347 M, 347 DA

[56] References Cited

U.S. PATENT DOCUMENTS

| 3,787,836 | 1/1974 | Hagelbarger | 340/347 DA |
| 3,789,393 | 1/1974 | Tripp | 340/347 DA |
| 3,823,396 | 7/1974 | Lode | 340/347 DA |

Primary Examiner—Charles D. Miller
Attorney, Agent, or Firm—Burgess, Ryan and Wayne

[57] ABSTRACT

Disclosed is a digital-to-analog converter wherein a counter comprising a number of $n - m$ (where $n > m$) flip-flops is so arranged that an $m$-bit and $(n - m)$-bit outputs may be alternately derived, weighted and added to derive an $n$-bit output which in turn is smoothed to deliver a DC output.

5 Claims, 5 Drawing Figures

DIGITAL-TO-ANALOG CONVERTER

BACKGROUND OF THE INVENTION

The present invention relates to a digital-to-analog or DA converter of the type which delivers a DC output by switching a reference voltage in response to a pulse whose duration in turn is varied in response to a digital input.

In FIG. 1 there is shown a prior art DA converter which delivers a DC output in response to a digital signal comprising of four bits. It has four T flip-flops $2a$–$2d$ connected in cascade and clock pulses at a clock pulse input terminal 1 are applied to a T terminal of the first-stage flip-flop $2a$. Outputs A, B C and D of these flip-flops $2a$–$2d$ are applied to a NOR gate 3 whose output is applied through an inverter 4 to an input terminal S of a RS flip-flop 5. Outputs $\overline{A}$, $\overline{B}$, $\overline{C}$ and $\overline{D}$ are applied to one inputs of AND gates $6a$–$6d$ and a binary coded signal is applied to four input terminals $7a$–$7d$. For instance, bits of input signals (1,0,0,0), (0,0,0,0) and so on are applied to the input terminals $7a$–$7d$, respectively. These input terminals are connected through inverters $8a$–$8d$ to the other inputs of AND gates $6a$–$6d$ and directly to one inputs of AND gates $9a$–$9d$ whose the other inputs are applied with outputs A, B, C and D of the flip-flops $2a$–$2d$. The outputs of the AND gates $6a$–$6d$ and $9a$–$9d$ are so wired as to provide an OR output which in turn is applied through an inverter 11 to an input R of the flip-flop 5 whose output $\overline{Q}$ is applied through a resistor 12 to a base of a switching transistor 13 with a collector impressed with a DC voltage E from a terminal 15 through a resistor 14. The collector output from the transistor 13 is smoothed by a filter 16 and a DC voltage is derived from an output terminal 17.

Next referring further to FIG. 2, the mode of operation of the DA converter with the above construction will be described. A clock pulse train shown in FIG. $2\emptyset$ is applied to the input terminal 1 so that the flip-flops $2a$–$2d$ deliver the outputs as shown in FIGS. 2 A, $\overline{A}$, B, $\overline{B}$, C, $\overline{C}$, D and $\overline{D}$. Assume that an input signal (1,0,0,0) is applied to the input terminals $7a$–$7d$. Then, the A output of the first flip-flop $2a$ is (1), the AND gate $9a$ delivers the output (1), and when the $\overline{B}$, $\overline{C}$ and $\overline{D}$ outputs of the flip-flops $2b$, $2c$ and $2d$ are (1), the AND gates $6b$, $6c$ and $6d$ deliver the outputs (1). Except for the above conditions, no (1) signal appears at a terminal 10, the output at this terminal being indicated at $P_1$ in FIG. 2.

When another input signal (0,1,0,0) is applied to the input terminals $7a$–$7d$, the AND gates $6a$, $6c$ and $6d$ deliver the outputs (1) when the $\overline{A}$ output of the flip-flop $2a$, the $\overline{C}$ output of the flip-flop $2c$ and the $\overline{D}$ output of the flip-flop $2d$ are (1). Alternatively, when the B output of the flip-flop $2b$ is (1), the AND gate $9b$ delivers the output (1). Except the above conditions, no (1) output appears at the terminal 10, the output at this terminal being indicated at $P_2$ in FIG. 2.

When an input signal (1,1,1,1) is applied to the terminals $7a$–$7d$, the AND gates $9a$–$9d$ deliver the outputs (1) when the A, B, C and D outputs from the flip-flops $2a$–$2d$ are (1). Except the above condition, no output (1) appears at the terminal 10, the output at this terminal being indicated at $P_{16}$ in FIG. 2.

The A, B, C and D outputs of the flip-flops $2a$–$2d$ are applied to NOR gate 3 and when they are all (0), the NOR gate 3 delivers the output (1) which is inverted by the inverter 4 and applied to the S terminal of the RS flip-flop 5 as shown at S in FIG. 2. Therefore, when the output at the terminal 10 is $P_1$, $P_2$ or $P_{16}$, the RS flip-flop 5 delivers the $\overline{Q}$ output as shown at $Q_1$, $Q_2$ or $Q_{16}$ in FIG. 2. Thus, it is seen that in response to the binary coded input signal applied to the input terminals the pulse duration of the $\overline{Q}$ output of the RS flip-flop 5 varies. This $\overline{Q}$ output with a varying pulse duration is applied to the base of the switching transistor 13 to drive it into state (1) and the output of the switching transistor 13 is smoothed by the filter 16 to derive the DC voltage corresponding to the input signal.

The DA converter of the type described has a defect that the greater the number of bits of an input signal the higher the clock pulse frequency becomes. For instance, with a 14-bit DA converter with the switching frequency of the output of the RS flip-flop 5 being about 61 Hz, the clock pulse frequency is about 1 MHz. With the conventional P-channel MOS LSIs, the upper limit is about 1 MHz at which the signals may be processed in correct waveforms. Furthermore, the prior art DA converter has a defect that a filter or smoothing circuit large in size must be provided in order to handle the signals of a low frequency so that a rise time as well as a fall time of voltage are increased. Therefore, a lower switching frequency limit is about 60 Hz in practice.

A 14-bit DA converter which is used in an electronic tuning device for a television receiver consists of 14 T flip-flops and one RS flip-flop. For this purpose, the number of T flip-flops in the DA converter shown in FIG. 1 may be increased to 14.

SUMMARY OF THE INVENTION

In view of the above, one of the objects of the present invention is to provide a DA converter which may operate at clock pulses at a lower frequency and which may incorporate a smoothing or filter circuit which is compact in size.

Another object of the present invention is to provide a DA converter which may use a minimum number of flip-flops so that a considerable cost reduction may be attained.

To the above and other ends, the present invention provides a DA converter wherein a number of $n - m$ (where $n > m$) flip-flops are so arranged that an output consisting of m-bits and an output consisting of ($n - m$)-bits may be alternately derived, weighted and added to derive an output consisting of n-bits and this output is smoothed to derive a DC output.

DESCRIPTION OF THE PREFERRED EMBODIMENT

Figure 3:
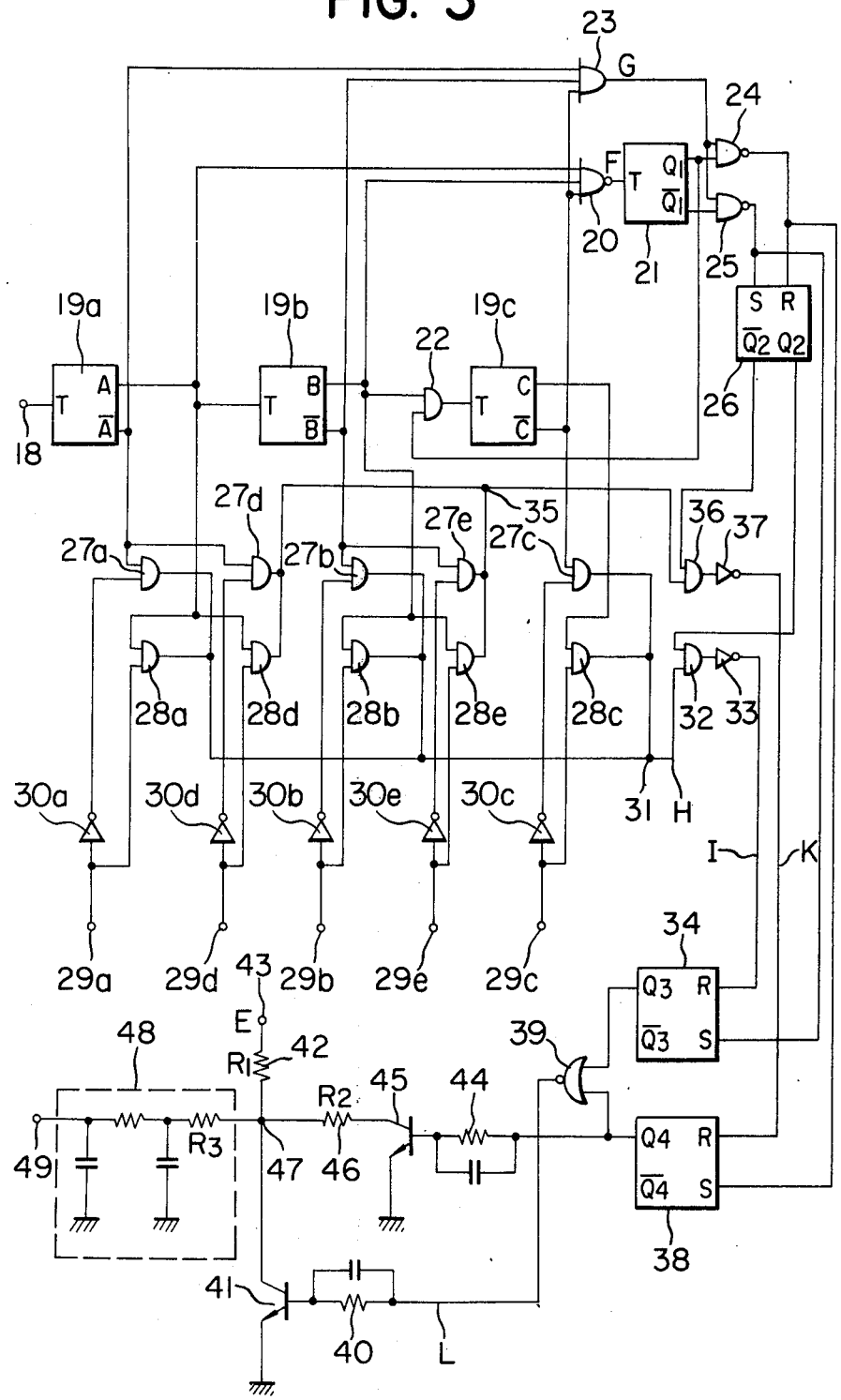
FIG. 3 is a block diagram of a preferred embodiment of a DA converter in accordance with the present invention.

In FIG. 3 there is shown a preferred embodiment of the present invention capable of converting a 5-bit input signal into an analog signal. Three or first, second and third T flip-flops $19a$, $19b$ and $19c$ are connected in cascade and a clock pulse train at a clock pulse terminal 18 is applied to a T input terminal of the first flip-flop 19a. A, B and $\overline{C}$ outputs of the flip-flops 19a, 19b and 19c are applied to a NAND gate 20. Therefore, the latter delivers the output (0) when the A, B and C outputs of the flip-flops 19a, 19b and 19c are (1,1,0) and under any other conditions or combinations of the outputs of the NOR gate 20 delivers the output (1) as shown at F in FIG. 4. The output of the NOR gate 20 is applied to a T input terminal of a T flip-flop 21 whose outputs are shown at $Q_1$ and $\overline{Q}_1$ in FIG. 4. A B output terminal of the second flip-flop 19b is connected to a T input terminal of the flip-flop 19c at the third stage through an AND gate 22 to which is applied as a gate signal the $Q_1$ output of the flip-flop 21. Therefore, the third flip-flop 19c delivers the output shown at C in FIG. 4. More specifically, the C output of the flip-flop 19c would rise at a time $C_1$, but is suppressed by a signal $Q_1$ and rises at a time $C_2$. In other words, the T flip-flop in the last stage of a three-stage flip-flop assembly alternately delivers a positive pulse whose duration corresponds to two bits and a negative pulse whose duration corresponds to three bits.

Figure 4:
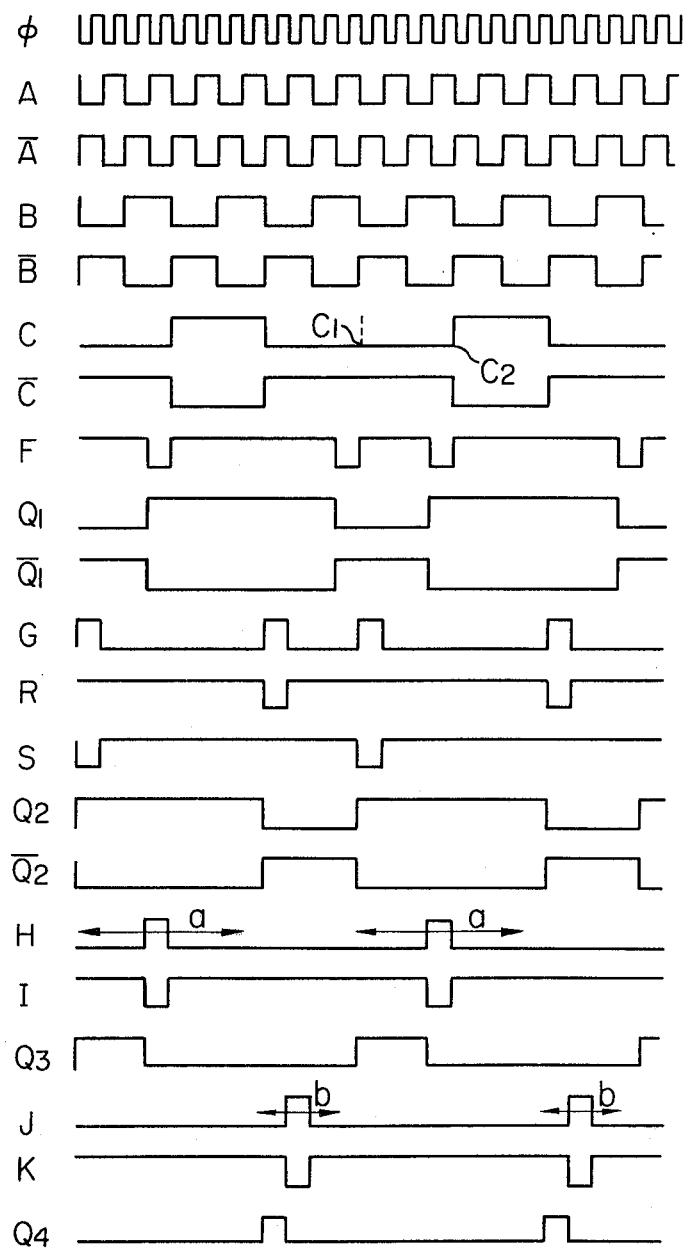
FIGS. 4 and 5 shows waveforms of signals used for the explanation thereof.

$\overline{A}$, $\overline{B}$ and $\overline{C}$ outputs of the flip-flops 19a, 19b and 19c are applied to a an AND gate 23 which delivers an output (1) only when the A, B and C outputs are (0,0,0) as shown at G in FIG. 4. The G signal is applied to one input terminals of NAND gates 24 and 25 while the Q and $\overline{Q}_1$ outputs of the flip-flop 21 are applied to the other inputs of NAND gates 24 and 25, respectively. The output of the NAND gate 24; that is, a NAND output of G and $Q_1$ is applied to a R input of a RS flip-flop 26 as shown at R in FIG. 4, while the output of the NAND gate 25; that is, a NAND output of G and $\overline{Q}_1$ is applied to a S input of the flip-flop 26 as shown at S in FIG. 4. $Q_2$ and $\overline{Q}_2$.

The $\overline{A}$, $\overline{B}$ and $\overline{C}$ outputs of the flip-flops 19a, 19b and 19c are applied to one inputs of AND gates 27a, 27b and 27c, respectively, while the A, B and C outputs, to one inputs of AND gates 28a, 28b and 28c, respectively.

A binary coded input signal is applied to input signal terminals 29a–29e and signals at the terminals 29a, 29b and 29c are applied to the other inputs of AND gates 27a, 27b and 27c, respectively, through inverters 30a, 30b and 30c and directly to the other inputs of AND gates 28a, 28b and 28c. The outputs of the AND gates 27a, 27b, 27c, 28a, 28b and 28c are connected to a common terminal 31 which in turn is connected to one input of an AND gate 32 the other input of which is connected to the $Q_2$ output of the flip-flop 26. At the terminal 31 as shown in at H in FIG. 4 one-bit pulse shifts within a time interval a in response to the input signals at the terminals 29a, 29b and 29c. The output of the AND gate 32 is inverted by an inverter 33 as shown at I in FIG. 4 and is applied to a R input of a RS flip-flop 34 whose S input is applied with the S input signal (See FIG. 4S) of the RS flip-flop 26. $Q_3$ output of the RS flip-flop 34 is shown at $Q_3$ in FIG. 4. Thus, it is seen that the pulse duration of the signal $Q_3$ changes in response to the input signals at the terminals 29a, 29b and 29c.

Figure 5:
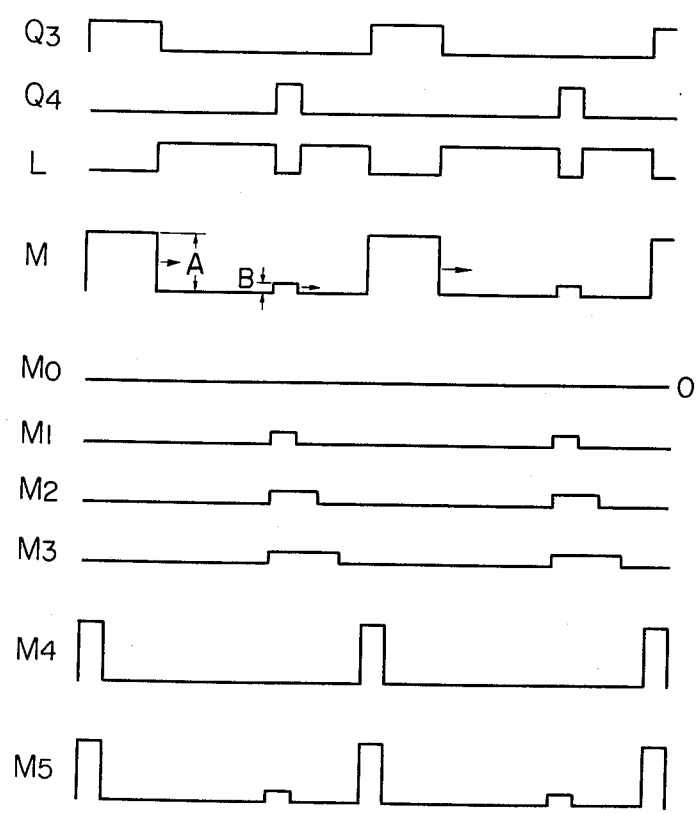

$\overline{A}$ and $\overline{B}$ outputs of the flip-flops 19a and 19b are applied to one inputs of AND gates 27d and 27e, respectively, and the A and B outputs of the flip-flops 19a and 19b are applied to one inputs of AND gates 28d and 28e, respectively. The input signals at the terminals 29d and 29e are applied to the other inputs of AND gates 28d and 28e through inverters 30d and 30e and directly to the other inputs of AND gates 28d and 28e. The outputs of the AND gates 27d, 38d, 27e and 28e are connected to a common terminal 35 to deliver an OR output to one input of an AND gate 36 whose the other input is connected to the $\overline{Q}_2$ output of the RS flip-flop 26. As is the output at the terminal 31 the output pulse at the terminal 35 shifts within an interval b in response to the input signals at 29d and 29e as shown at J in FIG. 4. The output of the AND gate 36 is inverted by an inverter 37 and is applied to R input of a flip-flop 38 as shown at K in FIG. 4, whereas the R input to the RS flip-flop 26 is applied to a S input (See FIG. 4R). The $Q_4$ output of the flip-flop 38 is shown at $Q_4$ in FIG. 4 and has a pulse duration which varies in response to the input signal. In FIG. 5 the outputs at the $Q_3$ and $Q_4$ outputs of the flip-flops 34 and 38 are shown again for the sake of reference with signals to be described below. That is, a counter consisting of three T flip-flops 19a, 19b and 19c for alternately counting two and three bits delivers the output $Q_3$ corresponding to three bits and the output $Q_4$ corresponding to two bits.

The $Q_3$ and $Q_4$ outputs of the RS flip-flops 34 and 38 are applied to a NOR gate 39 which in turn delivers the output shown at L in FIG. 5 to the base of a switching transistor 41 through a resistor 40. The emitter of the switching transistor 41 is grounded while the collector is connected through a resistor 42 to a DC power supply terminal 43. The $Q_4$ output of the RS flip-flop 38 is also applied through a resistor 44 to the base of a second switching transistor 45 whose emitter is grounded and whose collector is connected through a resistor 46 to the collector of the first switching transistor 41. A junction point between the resistors 42 and 46 and the collector of the transistor 41 is connected through a smoothing circuit 48 to an output terminal 49.

If the outputs $Q_3$ and $Q_4$ themselves were added and smoothed, an output corresponding to an input signal consisting of five bits could not be obtained. Therefore, they must be added after they are weighted. It is for this purpose that the resistors 42 and 46 having suitable values $R_1$ and $R_2$ are provided.

In FIG. 5 switching outputs are indicated at $M_0 - M_5$. An amplitude A is dependent upon a voltage of the DC power supply and a ratio between A and B is dependent upon a ratio between $R_1$ and $R_2$. That is, $$B/A = 1/2^m = \frac{R_2}{R_1 + R_2}$$

where $m = a$ number of bits selected to generate the $Q_4$ output, and $$R_3 >> R_1 + R_2.$$

Therefore, when the transistor 45 is in the conduction state, the amplitude of the voltage at the junction point 47 is given by $$\frac{R_2}{R_1 + R_2} E$$

where E = voltage of DC power supply.

The waveforms shown at $M_0 - M_5$ in FIG. 5 correspond to the input signal 0; that is (0,0,0,0,0) applied to the input terminals 29e–29e, respectively; the input signal 1; that is, (0,0,0,0,1); the input signal 2; that is, (0,0,0,1,0); the input signal 3; that is, (0,0,0,1,1) and the input signal 4; that is, (0,0,1,0,0), the input signal 5; that is, (0,0,1,0,1).

The output of the NOR gate 39 to which are applied the $Q_3$ and $Q_4$ outputs from the RS flip-flops 34 and 38 is applied to the base of the first switching transistor 41 in order to prevent the latter from being driven into the conduction state when the second switching transistor 45 is in the conduction state. When both the first and second switching transistors 41 and 45 are turned off, the voltage at the junction point 47 is E, and since $m = 2$ in this preferred embodiment, $$B/A = \frac{\frac{R_2}{R_1 + R_2} \cdot E}{E} = \frac{R_2}{R_1 + R_2} = \frac{1}{4}$$

Hence, $$R_1 = 3 R_2$$

The voltage at the junction point 47 is smoothed by the smoothing circuit 48 so that the analog signal corresponding to the digital input signal may be obtained at the output terminal 49.

Figure 1:
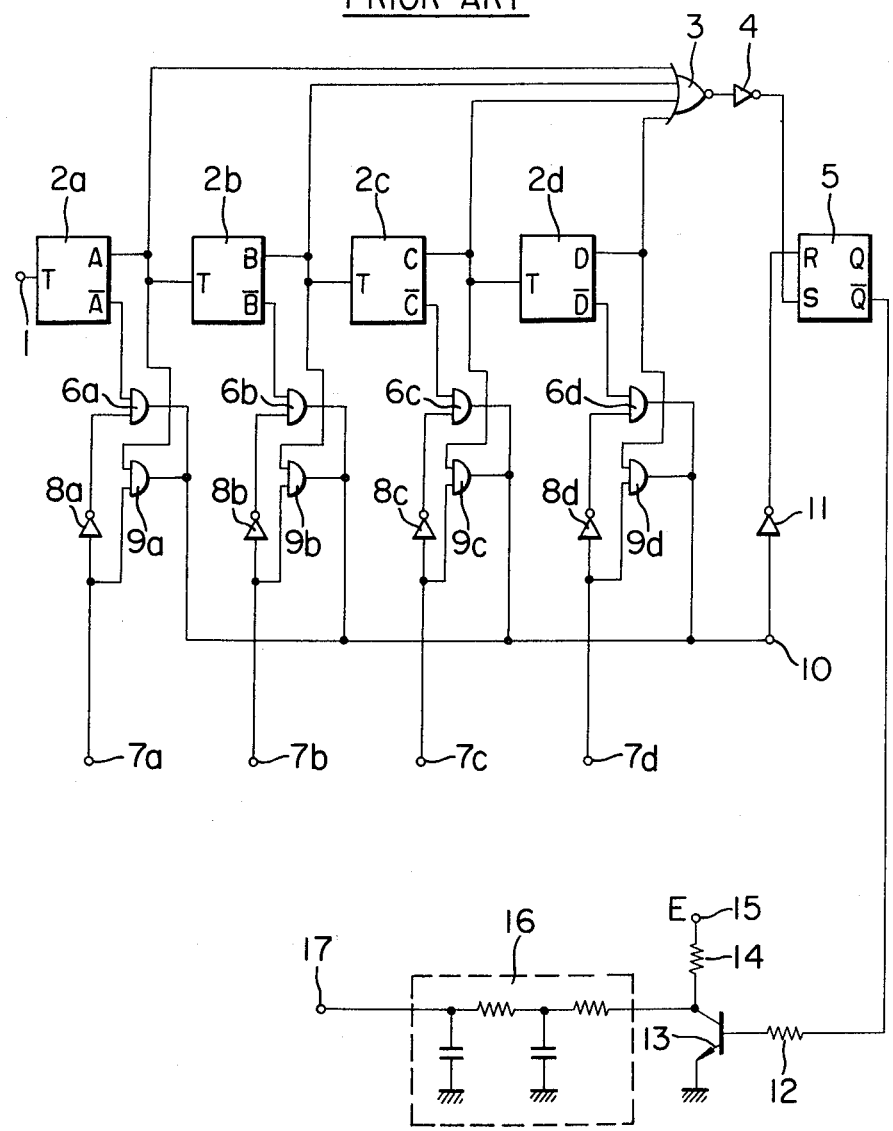
FIG. 1 is a block diagram of a prior art DA converter.
Figure 2:
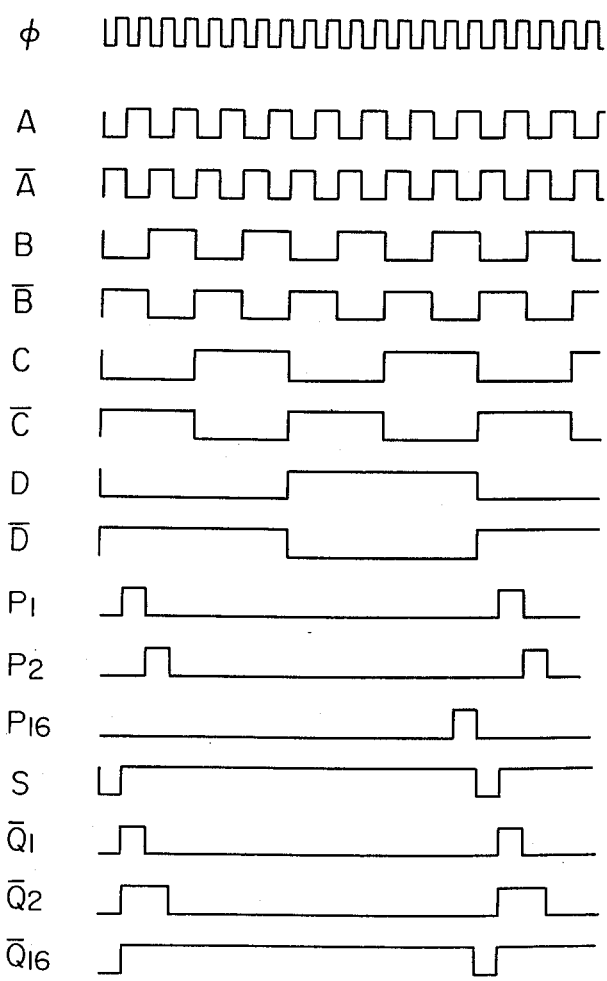
FIG. 2 shows waveforms of electrical signals at various points in the circuit shown in FIG. 1, which waveforms are used for the explanation of the mode of operation thereof.

As described above, according to the present invention a five-bit (n-bit) DA converter may be built up by a number of $n - m = 5 - 2 = 3$ T flip-flops, three RS flip-flops and an additional T flip-flop. So far the digital input signal has been described as consisting of five bits, but it will be understood that a DA converter capable of handling a digital input signal consisting of any number of bits may be built up in a manner substantially similar to that described above. For instance a DA converter with $n = 14$ and $m = 4$ may be built up by 10 T flip-flops, three RS flip-flops and one T flip-flop with AND gate 22 interconnected between the m-th and $(m + 1)$-th flip-flops. Whereas, the prior art 14-bit DA converter of the type shown in FIG. 1 requires 14 T flip-flops and one RS flip-flop totaling to 15 flip-flops, the DA converter in accordance with the present invention requires only 11 T flip-flops and 14 RS flip-flops so that the cost may be remarkably reduced only by the reduction in number of flip-flops. Therefore, the present invention is particularly advantageous when $n$ is greater than 14. When $n = 14$, $$\frac{R_2}{R_1 + R_2} = 1/2^m = 1/2^4 = 1/16$$

so that $R_1 = 15 R_2$.

When the frequency of the output at the output terminal 47 is set to 61 Hz as a result of a compromise with a response time of the filter or smoothing circuit 48, the frequency of clock pulses may be drastically reduced from the prior art frequency of 1 MHz to 250 KHz. As a consequence the DA converter in accordance with the present invention may be made up of the conventional P-channel MOS field-effect transistors. If the frequency of clock pulses is set to 1 MHz the frequency of output signal is 244 Hz so that a smoothing circuit compact in size may be used.

The outputs of the flip-flops 19 preceding and succeeding the AND gate 22 are all applied to NAND gates 20 and 23. In the preferred embodiment described above, only one flip-flop 19e succeeds AND gate 22, but if a plurality of T flip-flops succeed AND gate 22 their RESET outputs are applied to the NAND gates 20 and 23.

As described above, according to the present invention there may be provided a DA converter which is very simple in construction and the output frequency may be increased while the clock pulse frequency may be decreased. Thus the present invention is particularly advantageous when an input digital signal consists of a large number of bits.

What is claimed is:

1. A digital to analog converter comprising a serial counter having $n - m$ (where $n > m$) flip-flops arranged to deliver a first output consisting of m-bits and a second output consisting of $n - m$ bits, means for combining pulses corresponding to said m-bit and $(n - m)$-bit outputs in weighted fashion to derive an n-bit output, means for filtering said combined pulses to derive a DC output, an AND gate interconnected between the m-th and $(m + 1)$-th flip-flops of said counter, the output of said m-th flip-flop being connected to one input of said AND gate and the output of said m-th flip-flop being connected to the input of said $(m + 1)$-th flip-flop, the outputs of the first to m-th flip-flops being connected to the inputs of a first NAND gate and the outputs of the $(m + 1)$-th to the last flip-flops being connected to the remaining inputs of said NAND gate, the output of said NAND gate being connected to the input of an additional flip-flop, the output of said additional flip-flop being connected to the other input of said AND gate, whereby said m-bit and $(n - m)$-bit outputs may be alternately derived.

2. A digital to analog converter as set forth in claim 1 further characterized in that the amplitude A of said $(n - m)$-bit output and the amplitude B of said m-bit output are so weighted that their ratio may be $$B/A = \tfrac{1}{2}^m.$$

3. A digital to analog converter as set forth in claim 1 wherein an output from a first OR gate to which are applied the outputs derived by performing a sequence of logical operations of the outputs from a number of $(n - m)$ flip-flops in said counter and bit signals of an input digital signal applied to $(n - m)$ input terminals, respectively, is derived to provide said $(n - m)$-bit output, and an output from a second OR gate to which are applied the outputs derived by performing a sequence of logical operations of the outputs from the first to m-th flip-flops in said counter and bit signals of said input digital signal applied to $m$ input terminals, respectively, is derived to provide said m-bit output.

4. A digital to analog converter according to claim 1, further comprising a first group of outputs from the first to m-th flip-flops in said counter, said first group of outputs being a polarity opposite to that of the outputs applied to said first NAND gate, and a second group of outputs from the $m + 1$-th to last flip-flops in said counter, said second group of outputs also having a polarity opposite to that of the outputs applied to said first NAND gate, said first and second groups of outputs being coupled to a second NAND gate, the output from said second NAND gate and a pair of outputs of opposite polarity thereto, from said additional flip-flop, being applied to a pair of additional NAND gates, the outputs from said pair of additional NAND gates being applied to the set terminals of a pair of set-reset flip-flops, an output being derived from a first OR gate to provide said $(n - m)$-bit output, the outputs derived by performing a sequence of logical operations of the outputs from $(n - m)$ flip-flop in said counter and bit signals of an input digital signal applied to a number $(n - m)$ of input terminals, respectively, being applied to said first OR gate, an output being derived from a second OR gate to provide said m-bit output, the outputs derived by performing a sequence of logical operations of the outputs from the first to m-th flip-flops in said counter and bit signals of said input digital signal applied to a number $m$ of input terminals being applied to said second OR gate, and said $(n - m)$-bit and m-bit outputs being applied to the reset terminals of said pair of set-reset flip-flops, whereby a rectangular waveform signal whose duration encompasses the output pulses from said additional pair of NAND gates, said $(n - m)$-bit output and said m-bit output may be derived from the output terminals of said pair of set-reset flip-flops.

5. A digital to analog converter as set forth in claim 4, wherein the output signal from the set-reset flip-flop to which said m-bit output is applied is coupled to the base of a first switching transistor and to a NOR gate, the output signal from the set-reset flip-flop to which said $(n - m)$-bit output is coupled to said NOR gate, the output signal from said NOR gate is applied to the base of a second switching transistor, the emitters of said first and second switching transistors are grounded, the collector of said first switching transistor is connected through a first resistor to the collector of said second switching transistor, a junction point between said collector of said first switching transistor and said first resistor is coupled to a source of DC voltage through a second resistor and is connected to a smoothing circuit, and $R_1 = (2^m - 1) R_2$ where
$R_1$ = the value of said second resistor and
$R_2$ = the value of said first resistor.

* * * * *

UNITED STATES PATENT OFFICE
CERTIFICATE OF CORRECTION

Patent No. 4,117,476          Dated September 26, 1978

Inventor(s) Yukio Koyanagi

It is certified that error appears in the above-identified patent and that said Letters Patent are hereby corrected as shown below:

Column 1, line 38: "20" should be --2∅--.

Signed and Sealed this

Twentieth Day of March 1979

[SEAL]

Attest:

RUTH C. MASON
Attesting Officer

DONALD W. BANNER
Commissioner of Patents and Trademarks